(12) United States Patent
Lien et al.

(10) Patent No.: US 10,852,786 B2
(45) Date of Patent: Dec. 1, 2020

(54) VENTING GRATE FOR AN INFORMATION HANDLING SYSTEM

(71) Applicant: DELL PRODUCTS, LP, Round Rock, TX (US)

(72) Inventors: Chuck Lien, Taipei (TW); Yi-Hsin Kuan, Taipei (TW); Chuan Chieh (Dennis) Tseng, Taipei (TW); Chin-Chia Chang, New Taipei (TW); Richard A. Crisp, Austin, TX (US); Timothy C. Dearborn, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 348 days.

(21) Appl. No.: 15/585,950

(22) Filed: May 3, 2017

(65) Prior Publication Data
US 2018/0321716 A1 Nov. 8, 2018

(51) Int. Cl.
*G06F 1/20* (2006.01)
*G06F 1/18* (2006.01)
(Continued)

(52) U.S. Cl.
CPC .............. *G06F 1/20* (2013.01); *F24F 13/082* (2013.01); *H05K 7/20145* (2013.01); *H05K 7/20727* (2013.01); *F24F 2013/088* (2013.01)

(58) Field of Classification Search
CPC .... G06F 1/181–182; G06F 1/20; G06F 1/182; H05K 7/20218–20381; H05K 7/20409–20418; H05K 7/20009–202; H05K 7/20727; H01L 23/367–3677; H01L 23/473; H01L 23/46–467; F24F 13/082; F24F 2013/088

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 1,435,345 A * 11/1922 Stewart .................... B60R 19/52
180/68.4
2,182,690 A * 12/1939 Cole ......................... F24F 1/00
454/309
(Continued)

OTHER PUBLICATIONS

DME Surface Finishing, Milacron, 356 pages, No Date, downloaded from https://www.milacron.com/wp-content/uploads/2018/07/DME_Surface_Finishing_EN.pdf on Apr. 19, 2020 (Year: ND) (Year: ND).*

(Continued)

*Primary Examiner* — Robert J Hoffberg
(74) *Attorney, Agent, or Firm* — Larson Newman, LLP

(57) ABSTRACT

A venting grate includes a main portion, a first venting area, and a second venting area. The first venting area is defined by first, second, third, and fourth edges. Each of the first, second, third, and fourth edges extend from the main portion. The second venting area is defined by fifth, sixth, seventh, and eighth edges. Each of the fifth, sixth, seventh, and eighth edges extend from the main portion. The third edge and the fifth edge extend away from the main portion of the venting grate and angle together to form a pointed edge between the first and second venting areas.

20 Claims, 3 Drawing Sheets

(51) Int. Cl.
*H05K 7/20* (2006.01)
*F24F 13/08* (2006.01)

(56) References Cited

U.S. PATENT DOCUMENTS

| | | | | |
|---|---|---|---|---|
| 2,506,951 | A * | 5/1950 | Doane | F21V 11/14 |
| | | | | 362/341 |
| 2,803,741 | A * | 8/1957 | Guth | E04B 9/345 |
| | | | | 362/149 |
| 5,890,959 | A * | 4/1999 | Pettit | H05K 7/2019 |
| | | | | 137/849 |
| 6,100,468 | A * | 8/2000 | Niggl | H05K 7/20572 |
| | | | | 174/535 |
| 6,193,339 | B1 * | 2/2001 | Behl | G11B 33/02 |
| | | | | 312/223.2 |
| 6,297,950 | B1 * | 10/2001 | Erwin | B01D 46/0005 |
| | | | | 361/679.49 |
| 6,690,576 | B2 * | 2/2004 | Clements | H05K 7/20181 |
| | | | | 165/80.3 |
| 6,918,456 | B2 * | 7/2005 | Dennison | B60K 11/08 |
| | | | | 180/68.1 |
| 6,947,294 | B2 * | 9/2005 | Lin | H05K 9/0041 |
| | | | | 174/383 |
| 7,520,789 | B1 * | 4/2009 | Carlson | B63H 11/01 |
| | | | | 440/46 |
| 7,609,517 | B2 * | 10/2009 | Sun | H05K 7/20727 |
| | | | | 361/690 |
| 7,611,403 | B2 * | 11/2009 | Wenger | F24F 7/013 |
| | | | | 415/147 |
| 7,762,765 | B2 * | 7/2010 | Milks | F04D 29/601 |
| | | | | 415/121.2 |
| 7,794,294 | B2 * | 9/2010 | Carlson | B63H 11/01 |
| | | | | 440/46 |
| 8,070,539 | B2 * | 12/2011 | Carlson | B63H 11/01 |
| | | | | 440/46 |
| 8,216,034 | B1 * | 7/2012 | Sona | F24F 13/085 |
| | | | | 454/275 |
| 8,867,204 | B1 * | 10/2014 | Gardner | H05K 7/1497 |
| | | | | 361/679.46 |
| 9,557,072 | B2 * | 1/2017 | Tolinski | F24F 13/082 |
| 9,751,190 | B2 * | 9/2017 | Jarchau | B01D 29/012 |
| 2002/0167794 | A1 * | 11/2002 | Ronzani | G06F 1/163 |
| | | | | 361/679.54 |
| 2003/0026074 | A1 * | 2/2003 | Clements | H05K 7/20181 |
| | | | | 361/695 |
| 2005/0159098 | A1 * | 7/2005 | Johnson | H05K 7/20581 |
| | | | | 454/184 |
| 2005/0163607 | A1 * | 7/2005 | Wang | F04D 25/166 |
| | | | | 415/98 |
| 2007/0133168 | A1 * | 6/2007 | Shabany | H05K 7/20581 |
| | | | | 361/695 |
| 2009/0086429 | A1 * | 4/2009 | Grosskreuz | H05K 7/20172 |
| | | | | 361/695 |
| 2011/0038121 | A1 * | 2/2011 | Tabasso | G06F 1/1632 |
| | | | | 361/679.51 |
| 2012/0009862 | A1 * | 1/2012 | Meyer | H05K 7/20745 |
| | | | | 454/184 |
| 2013/0265713 | A1 * | 10/2013 | Crane | G06F 1/20 |
| | | | | 361/679.51 |
| 2014/0140001 | A1 * | 5/2014 | Gerken | H05K 9/0041 |
| | | | | 361/690 |
| 2014/0204516 | A1 * | 7/2014 | Reynolds | E04F 15/02405 |
| | | | | 361/679.5 |
| 2014/0216683 | A1 * | 8/2014 | Meyer | H05K 7/20745 |
| | | | | 165/48.1 |
| 2015/0226450 | A1 | 8/2015 | Du | |
| 2015/0261269 | A1 * | 9/2015 | Bruscoe | G06F 1/20 |
| | | | | 361/679.47 |
| 2015/0286256 | A1 * | 10/2015 | Delano | G06F 1/203 |
| | | | | 361/679.26 |
| 2015/0378402 | A1 * | 12/2015 | Nakano | G11B 33/08 |
| | | | | 361/679.34 |
| 2016/0192542 | A1 * | 6/2016 | LeFebvre | H05K 7/20836 |
| | | | | 361/679.47 |
| 2016/0236131 | A1 | 8/2016 | Lin | |
| 2017/0027087 | A1 * | 1/2017 | Meyer | H05K 7/20745 |
| 2017/0149228 | A1 * | 5/2017 | Pawluk | H02G 3/0437 |
| 2017/0273225 | A1 * | 9/2017 | Meyer | H05K 7/20181 |
| 2018/0066858 | A1 * | 3/2018 | Fiser | F24F 7/02 |
| 2018/0070473 | A1 * | 3/2018 | Zhang | H05K 7/20181 |

OTHER PUBLICATIONS

Picture of a storm drain with close-up view of the storm drain, 2 pages (Year: No date).*

* cited by examiner

VENTING GRATE FOR AN INFORMATION HANDLING SYSTEM

FIELD OF THE DISCLOSURE

The present disclosure generally relates to information handling systems, and more particularly relates to a venting grate for an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A venting grate includes a main portion, a first venting area, and a second venting area. The first venting area is defined by first, second, third, and fourth edges. Each of the first, second, third, and fourth edges extend from the main portion. The second venting area is defined by fifth, sixth, seventh, and eighth edges. Each of the fifth, sixth, seventh, and eighth edges extend from the main portion. The third edge and the fifth edge extend away from the main portion of the venting grate and angle together to form a pointed edge between the first and second venting areas.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
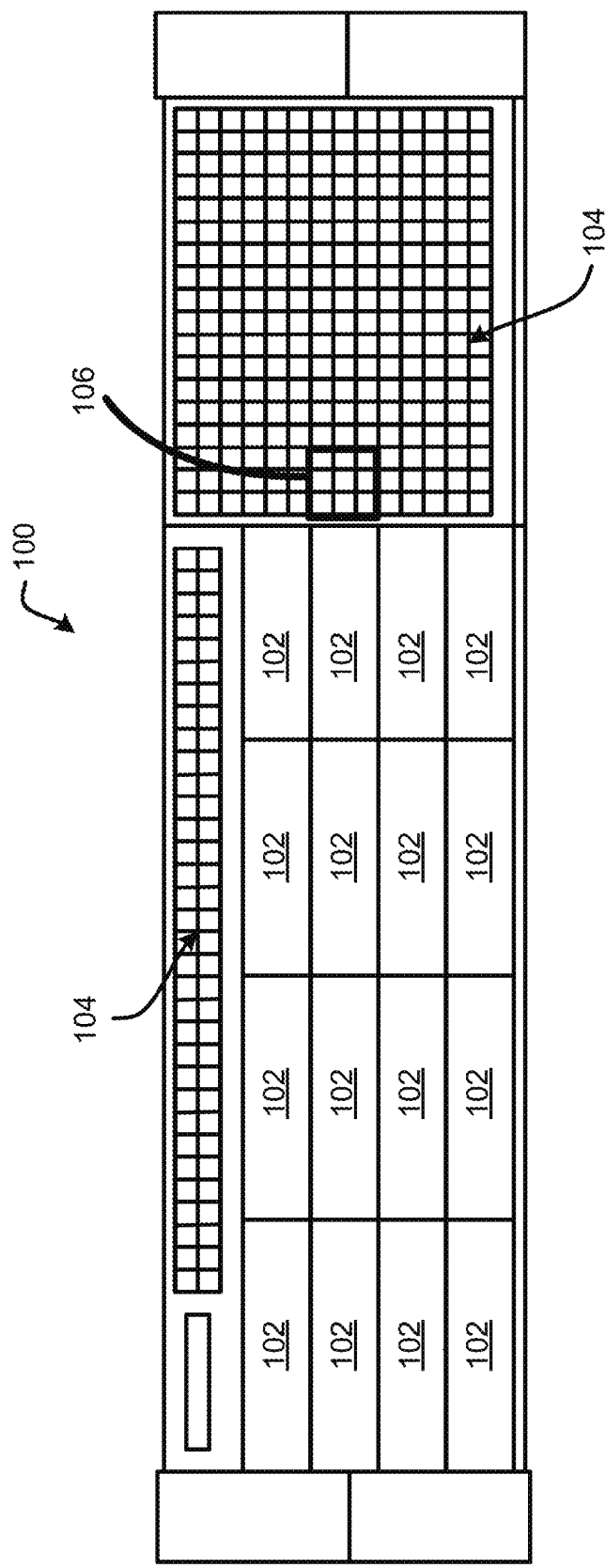
FIG. 1 is a front view of a chassis including venting grates according to at least one embodiment of the present disclosure.

FIG. 1 shows a chassis 100 including multiple information handling systems 102, and venting grates 104. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more buses operable to transmit communications between the various hardware components.

The information handling systems 102 of the chassis 100 can be any type of device, such as a compute device, storage device, or the like. During operation, the information handling systems 102 generate heat that should be dissipated and removed from within the chassis 100. In an embodiment, the heat can be removed via airflow pulled through the venting grates 104 by fans within the chassis 100. The heated air can then be pushed out the back of the chassis 100. Airflow impedance through the venting grates 104 of the chassis 100 can pending on the design of the front of the venting grates 104 as will be described in greater detail with respect section 106 of the venting grates 104 in FIGS. 2-4 below.

Figure 2:
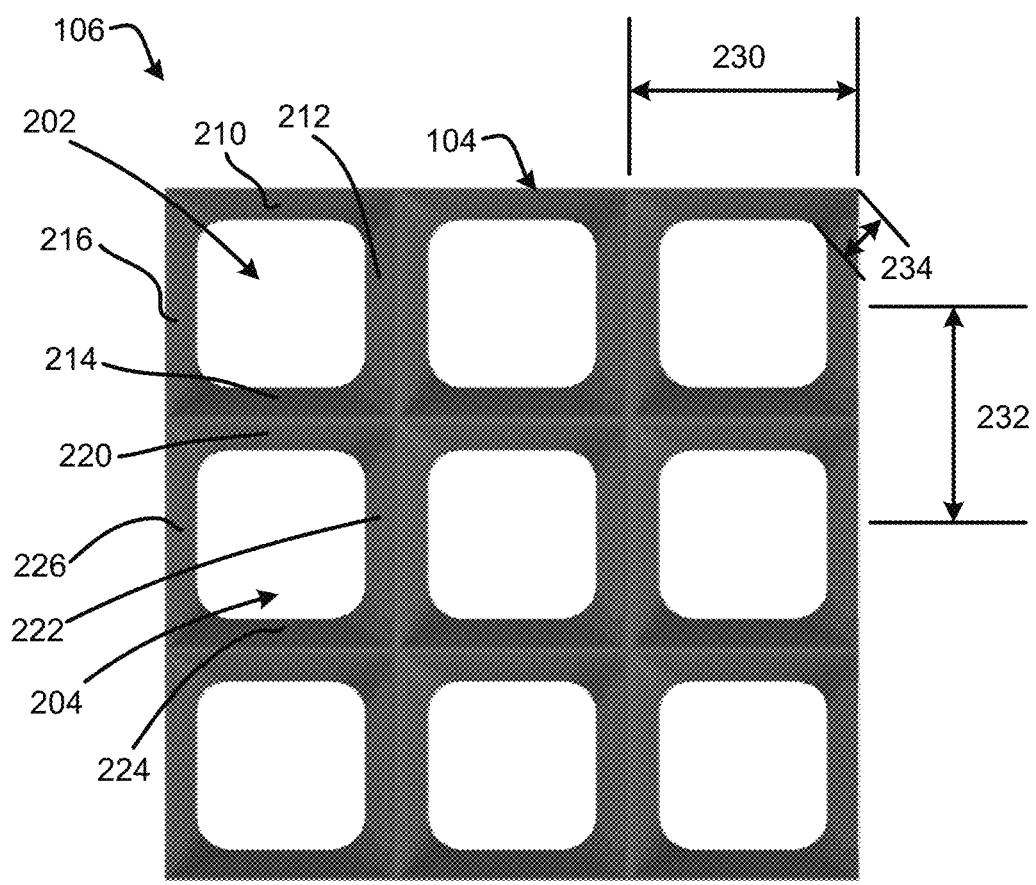
FIG. 2 is front view of a portion of the venting grate according to at least one embodiment of the present disclosure.
Figure 3:
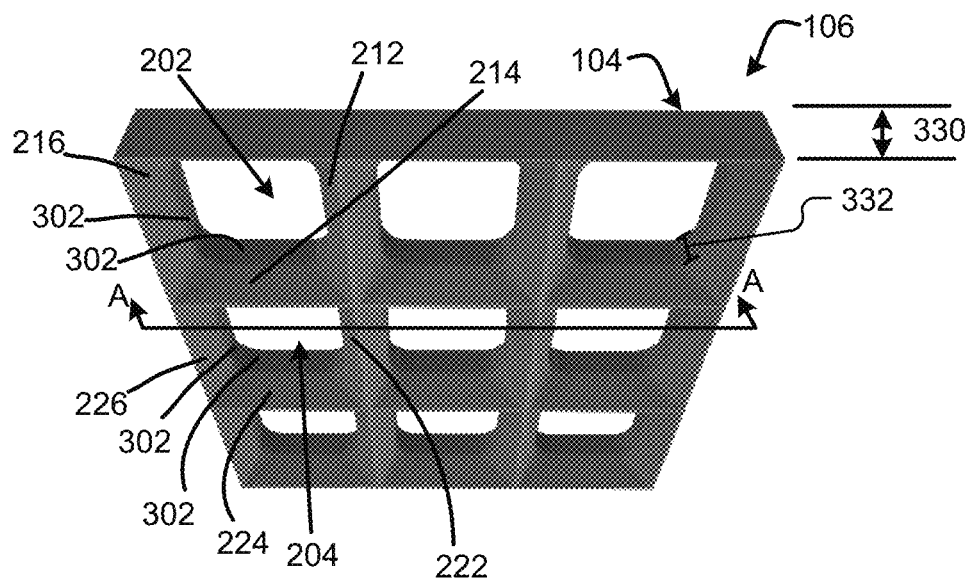
FIG. 3 is a perspective view of the portion of the venting grate shown in FIG. 2 according to at least one embodiment of the present disclosure.

FIG. 2 is front view of the portion 106 of a venting grate 104 according to at least one embodiment of the present disclosure. FIG. 3 is a perspective view of the portion 106 of the venting grate 104 according to at least one embodiment of the present disclosure. The venting grate 104 includes multiple venting areas, such as venting areas 202 and 204. An opening of the venting area 202 is defined by edges 210, 212, 214, and 216, which in turn each include first and second ends. In an embodiment, edge 210 extends from the second end of edge 216 to the first end of edge 212, edge 212 extends from the second end of edge 210 to the first end of edge 214, edge 214 extends from the second edge of 212 to the first end of edge 216, and edge 216 extends from the second end of edge 214 to the first end of edge 210.

An opening of the venting area 204 is defined by edges 220, 222, 224, and 226, which in turn each include first and second ends. In an embodiment, edge 220 extends from the second end of edge 226 to the first end of edge 222, edge 222 extends from the second end of edge 220 to the first end of edge 224, edge 224 extends from the second edge of 222 to the first end of edge 226, and edge 226 extends from the second end of edge 224 to the first end of edge 220. As shown in FIG. 3, the venting grate 104 also includes a main portion 302 that the edges 210, 212, 214, and 216 of venting area 202 and edges 220, 222, 224, and 226 of venting area 204 are in physical communication with. In an embodiment, the main portion 302 forms straight edges within each of the venting areas, such as shown for venting areas 202 and 204.

Referring back to FIG. 2, the dimensions of the venting grate 104 can be any specific size to enable a desired amount of airflow into the chassis 100. For example, the venting areas, such as venting areas 202 and 204, can have a length 230, a width 232, a height 330 with the main portion having a depth of 332, and a diagonal distance 234 in the corners of the venting areas. In a particular embodiment, the length 230 can be 5.32 mm, the width 232 can be 5.5 mm, the height 330 can be 2.2 mm, the depth 332 of the main portion can be 1 mm, and the diagonal distance 234 can be 0.3 mm. Thus, in an embodiment, the depth or thickness 332 of the main portion 302 can be less than a height of the edges of the venting areas, such as edges 210, 212, 214, and 216 of venting area 202 and edges 220, 222, 224, and 226 of venting area 204.

Figure 4:
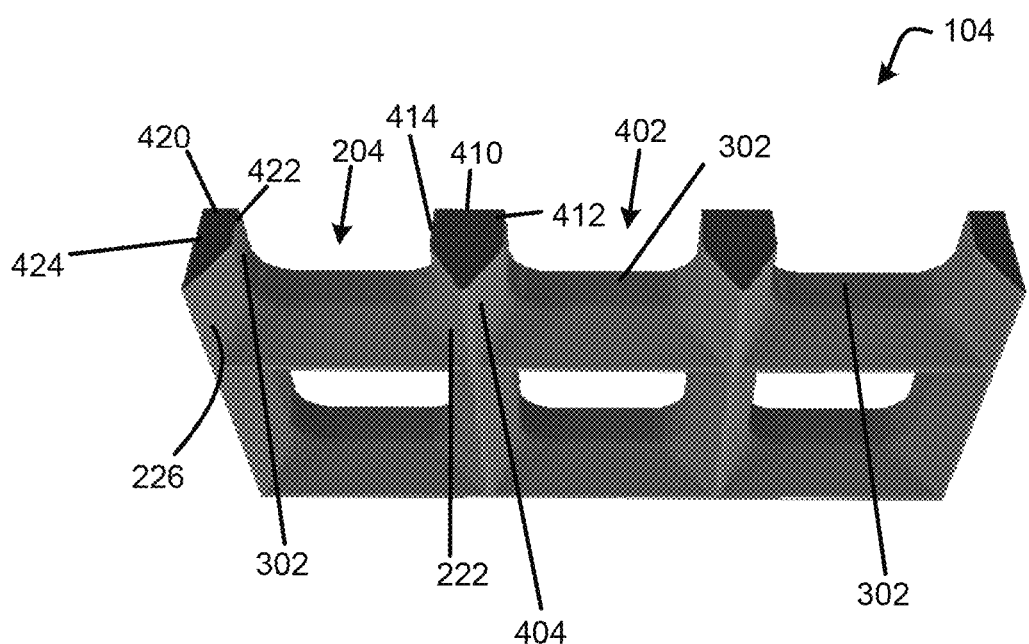
FIG. 4 is a perspective view of a cross section of the portion according to at least one embodiment of the present disclosure.

FIG. 4 is a perspective view of a cross section of the portion 106 taken along the line A-A in FIG. 3 according to at least one embodiment of the present disclosure. The main portion 302 and the edges of the venting areas of the venting grate 104 can combine to form a pointed front for the venting grate 104. For example, the main portion between venting areas 204 and 402 can include a bottom surface 410 and side surfaces 412 and 414. In an embodiment, surface 412 can extend away from a first end of surface 410, and surface 414 can extend away from a second end of surface 410. The edge 222 of venting area 204 can extend away from an end of surface 414 that is opposite of surface 410, and extend diagonally toward a center line of surface 410. Similarly, an edge 404 of venting area 402 can extend away from an end of surface 412 that is opposite of surface 410, and extend diagonally toward a center line of surface 410. Thus, edges 222 and 404 can join to create a pointed edge of the venting grate 104. In an embodiment, the edges of all adjacent venting areas can form pointed edges as described for edge 222 of venting area 204 and edge 404 of venting area 402.

At the edge of the venting grate 104, the edge of a venting area can form a point with a surface extended from the main portion 302. For example, the main portion in venting area 204 can include surface 420 and 422. In an embodiment, surface 422 can extend away from a first end of surface 420, and another surface 424 can extend away from a second end of surface 420. In an embodiment, the surface 424 can extend beyond the main portion 302 as shown in FIG. 4. The edge 226 of venting area 204 can then extend from an end of surface 424 that is opposite of surface 420 to an end of surface 422 that is opposite of surface 420. Thus, the edge 226 of venting area 204 can form a pointed edge of the venting grate 104. In an embodiment, the edges of venting areas can form pointed edges as described for edge 226 of venting area 204.

In an embodiment, the venting grate 104 can be made of a molded plastic with a smooth finish. In an embodiment, the finish can be a Society of Plastic Industry (SPI)-A2 finish. The pointed front venting grate 104 can reduce an amount of debris, such as fiber, hair, mote, cotton, dust, and the like, that accumulates on the front of the venting grate 104. In an embodiment, the pointed edges of venting grate 104 can also reduce airflow impedance through the venting grate 104 as compared to squared off venting grates as shown in Table 1 below.

TABLE 1

Airflow Impedance

| Airflow | Airflow Impedance | |
|---|---|---|
| | Square front | Pointed front |
| 25 CFM | 0.0082 | 0.0072 |
| 50 CFM | 0.0154 | 0.0092 |
| 75 CFM | 0.0236 | 0.0154 |
| 100 CFM | 0.0401 | 0.0247 |
| 125 CFM | 0.0565 | 0.0370 |
| 150 CFM | 0.0812 | 0.0524 |
| 175 CFM | 0.1089 | 0.0688 |
| 200 CFM | 0.1428 | 0.0925 |

Thus, as shown in Table 1 above the pointed venting grate 104 has lower airflow impedance at each airflow volume measure in cubic feet per minute (CFM) as compared to a venting grate with a square front. Therefore, the pointed edges of venting gate 104 can reduce the airflow impedance for airflow entering the chassis 100 and can reduce an amount of debris that accumulates on the surface of the venting grate as compared with a squared off venting grate.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (such as random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A venting grate comprising:
   a main portion including a plurality of side surfaces, a bottom surface, and first and second outside surfaces, wherein the side surfaces include first, second, third, fourth and fifth side surfaces, wherein the first, second, third, and fourth side surfaces extend substantially perpendicularly away from the bottom surface, the first, second, third, and fourth side surfaces to form a substantially square shape, the first side surface extends away from a first end of the bottom surface, the first outside surface extends substantially perpendicularly away from a second end of the bottom surface and extends beyond a height of the first side surface, wherein the first side surface and the first outside surface extend substantially parallel to one another, and the second outside surface extends substantially perpendicularly away from the bottom surface and extends beyond a height of the fifth side surface, wherein the fifth side surface and the second outside surface extend substantially parallel to one another;
   a first venting area defined by first, second, third, and fourth edges, each of the first, second, third, and fourth edges extending diagonally away from the main portion, wherein the first edge extends diagonally away from an end of the first side surface that is opposite of the bottom surface in a straight line to an end of the first outside surface that is opposite the bottom surface, the second edge extends diagonally away from the second side surface toward a second venting area, the third edge extends diagonally away from the third surface toward a third venting area, and the fourth edge extends diagonally away from the fourth surface toward a fourth venting area; and
   the second venting area adjacent to the first venting area and defined by fifth, sixth, seventh, and eighth edges, each of the fifth, sixth, seventh, and eighth edges extending diagonally away from the main portion, wherein the second edge and the fifth edge extend diagonally toward a center line and are joined to form a pointed edge between the adjacent first and second venting areas, wherein the sixth edge extends diagonally away from an end of the fifth side surface that is opposite of the bottom surface in a straight line to an end of the second outside surface that is opposite the bottom surface.

2. The venting grate of claim 1 wherein the first edge extends away from the main portion to form a sloped surface from a first end of the first edge to a second end of the first edge, wherein the second end of the first edge is in physical communication with the main portion.

3. The venting grate of claim 1 wherein the first venting area extends through the main portion from where the first, second, third, and fourth edges are in physical communication with the main portion.

4. The venting grate of claim 1 wherein a thickness of the main portion is less than a height of the venting grate.

5. The venting grate of claim 1 wherein the main portion, and the first second, third, fourth, fifth, sixth, seventh, and eighth edges are created from a molded plastic material.

6. The venting grate of claim 5 wherein a first portion of the side surfaces including the first side surface form straight edges within the first venting area.

7. The venting grate of claim 1 wherein the center line includes a line between the side surfaces of the main portion.

8. A chassis comprising:
a venting grate to facilitate airflow within the chassis, the venting grate including:
a main portion including a plurality of side surfaces, a bottom surface, and first and second outside surfaces, wherein the side surfaces include first, second, third, fourth and fifth side surfaces, wherein the first, second, third, and fourth side surfaces extend substantially perpendicularly away from the bottom surface, the first, second, third, and fourth side surfaces to form a substantially square shape, the first side surface extends away from a first end of the bottom surface, the first outside surface extends substantially perpendicularly away from a second end of the bottom surface and extends beyond a height of the first side surface, wherein the first side surface and the first outside surface extend substantially parallel to one another, and the second outside surface extends substantially perpendicularly away from the bottom surface and extends beyond a height of the fifth side surface, wherein the fifth side surface and the second outside surface extend substantially parallel to one another;
a first venting area defined by first, second, third, and fourth edges, each of the first, second, third, and fourth edges extending away from the main portion, wherein the first edge extends diagonally away from an end of the first side surface that is opposite of the bottom surface in a straight line to an end of the first outside surface that is opposite the bottom surface, the second edge extends diagonally away from the second side surface toward a second venting area, the third edge extends diagonally away from the third surface toward a third venting area, and the fourth edge extends diagonally away from the fourth surface toward a fourth venting area; and the second venting area that is disposed adjacent to the first venting area and is defined by fifth, sixth, seventh, and eighth edges, each of the fifth, sixth, seventh, and eighth edges extending away from the main portion, wherein the second edge and the fifth edge extend diagonally toward a center line and are in physical communication with each other to form a pointed edge between the adjacent first and second venting areas, wherein the sixth edge extends diagonally away from an end of the fifth side surface that is opposite of the bottom surface in a straight line to an end of the second outside surface that is opposite the bottom surface.

9. The chassis of claim 8 wherein the first edge extends away from the main portion to form a sloped surface from a first end of the first edge to a second end of the first edge, wherein the second end of the first edge is in physical communication with the main portion.

10. The chassis of claim 8 wherein the first venting area extends through the main portion from where the first, second, third, and fourth edges are in physical communication with the main portion.

11. The chassis of claim 8 wherein a thickness of the main portion is less than a height of the venting grate.

12. The chassis of claim 8 wherein the main portion, and the first second, third, fourth, fifth, sixth, seventh, and eighth edges are created from a molded plastic material.

13. The chassis of claim 12 wherein a first portion of the side surfaces including the first side surface form straight edges within the first venting area.

14. The chassis of claim 13 wherein a second portion of the side surfaces form straight edges within the second venting area.

15. A chassis comprising:
an information handling system; and
a venting grate to facilitate airflow within the chassis, wherein the airflow dissipates heat produced by the information handling system, the venting grate including:
a main portion including a plurality of side surfaces, a bottom surface, and first and second outside surfaces, wherein the side surfaces include first, second, third, fourth and fifth side surfaces, wherein the first, second, third, and fourth side surfaces extend substantially perpendicularly away from the bottom surface, the first, second, third, and fourth side surfaces to form a substantially square shape, the first side surface extends away from a first end of the bottom surface, the first outside surface extends substantially perpendicularly away from a second end of the bottom surface and extends beyond a height of the first side surface, wherein the first side surface and the first outside surface extend substantially parallel to one another, and the second outside surface extends substantially perpendicularly away from the bottom surface and extends beyond a height of the fifth side surface, wherein the fifth side surface and the second outside surface extend substantially parallel to one another;
a first venting area defined by first, second, third, and fourth edges, each of the first, second, third, and fourth edges extending away from the main portion, wherein the first edge extends diagonally away from an end of the first side surface that is opposite of the bottom surface in a straight line to an end of the first outside surface that is opposite the bottom surface, the second edge extends diagonally away from the second side surface toward a second venting area, the third edge extends diagonally away from the third surface toward a third venting area, and the fourth edge extends diagonally away from the fourth surface toward a fourth venting area; and
the second venting area adjacent to the first venting area and defined by fifth, sixth, seventh, and eighth edges, each of the fifth, sixth, seventh, and eighth edges extending away from the main portion, wherein the second edge and the fifth edge extend diagonally toward a center line and are joined together to form a pointed edge between the adjacent first and second venting areas, wherein the sixth edge extends diagonally away from an end of the fifth side surface that is opposite of the bottom surface in a straight line to an end of the second outside surface that is opposite the bottom surface.

16. The chassis of claim 15 wherein the first edge extends away from the main portion to form a sloped surface from a first end of the first edge to a second end of the first edge, wherein the second end of the first edge is in physical communication with the main portion.

17. The chassis of claim 15 wherein the first venting area extends through the main portion from where the first, second, third, and fourth edges are in physical communication with the main portion.

18. The chassis of claim 15 wherein a thickness of the main portion is less than a height of the venting grate.

19. The chassis of claim 15 wherein the main portion, and the first second, third, fourth, fifth, sixth, seventh, and eighth edges are created from a molded plastic material.

20. The chassis of claim 19 wherein a first portion of the side surfaces including the first side surface form straight edges within the first venting area.

\* \* \* \* \*